United States Patent [19]

Scifres et al.

[11] 4,280,106

[45] Jul. 21, 1981

[54] STRIPED SUBSTRATE PLANAR LASER

[75] Inventors: Donald R. Scifres, Los Altos; Robert D. Burnham, Los Altos Hills; William Streifer, Palo Alto, all of Calif.

[73] Assignee: Xerox Corporation, Stamford, Conn.

[21] Appl. No.: 39,425

[22] Filed: May 15, 1979

[51] Int. Cl.³ .............................................. H01S 3/19
[52] U.S. Cl. ............................................ 331/94.5 H
[58] Field of Search .................... 331/94.5 H; 357/18

[56] References Cited

PUBLICATIONS

Tsang et al., "Lateral Current Confinement by Reverse-Biased Junctions in GaAs–$Al_xGa_{1-x}$as DH Lasers", APL, vol. 30, No. 10, 15 May 1977, pp. 538–540.

Primary Examiner—James W. Davie
Attorney, Agent, or Firm—Leonard Zalman

[57] ABSTRACT

A channelled substrate diode laser in which transverse and longitudinal mode control is achieved by having the laser current profile flat over the substrate channel. A flat current profile over the substrate channel, which is achieved by having the width of the path of the pump current greater than the width of the channel, causes waveguiding to be influenced only by a fixed channel guiding factor.

7 Claims, 3 Drawing Figures

STRIPED SUBSTRATE PLANAR LASER

BACKGROUND OF THE INVENTION

A known solid state laser purported to have transverse mode control is characterized by a substrate channel and a current confinement structure on either the substrate or non-substrate side of the laser. The current confinement structure may take the form of a non-substrate contact or a pair of current blocking junctions boardering the substrate channel. Waveguiding of the optical power of the laser is controlled by establishment of an index of refraction differential, which differential has (1) a fixed (or channel guiding) component, due to the fixed difference of equivalent index of refraction between the channeled region and the regions adjacent to the channel, and (2) a varying component related to a varying current density profile. If the current confinement structure has a width comparable to the width of the substrate channel, then the pump current density profile in the region of the laser beam varies with the increasing light output intensity (increasing pump current) and, as a result, the index of refraction varies and waveguiding is influenced. That influence results in the laser having a non-linear or kinked power output vs. pump current profile. The kinks are the result of the movement of the laser mode along the plane of the laser p-n junction because of the light induced variations in pump current density profile. Such movement and non-linear power vs. current characteristic make it difficult to utilize the laser in a practical application.

SUMMARY OF THE INVENTION

To avoid the current profile kinks associated with the variations in current density profile, the proposed laser utilizes current confinement structures, on both the substrate and non-substrate sides of the laser, which are substantially wider than the substrate channel. The wider current confinement structures cause the current profile to have a flat portion which is wider than the substrate channel. With the current profile flat over the substrate channel, the varying component of the index of refraction caused by current variations is eliminated or substantially reduced. Thus, the dominant waveguiding effect is channel guiding. Since the channel configuration is fixed, channel guiding does not permit the laser mode to move and transverse mode control can be achieved. Also, with channel guiding, better longitudinal mode control is achieved since longitudinal modes also tend to follow the current profile.

A flat current profile over the substrate channel is achieved structurally by displacing the pair of current blocking substrate junctions from the substrate channel whereby a portion of the laser active region wider than the substrate channel is pumped. In addition, the non-substrate contact has a width substantially equal to the distance between the current blocking junctions. Such a structure causes the current profile to have a flat portion over the substrate channel such that waveguiding is only influenced by channel guiding which provides for stable transverse, as well as longitudinal, mode control.

DETAILED DESCRIPTION OF THE INVENTION

Figure 1:
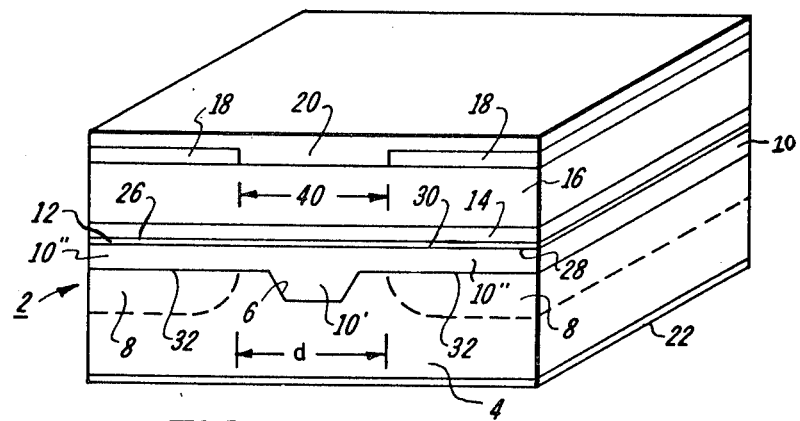
FIG. 1 is a schematic representation of a laser in accordance with the invention.

Referring first to FIG. 1, there is shown a diode laser 2 having a substrate 4 which includes a channel 6 in its upper surface and pump current guiding regions 8 on both sides of channel 6. Regions 8 are displaced from channel 6 and are of a conductivity type different from the conductivity type of substrate 4.

The upper surface of substrate 4 supports, a first light waveguiding and carrier confining layer 10 of non-uniform thickness due to the channel 6, a thin active region layer 12, a second light waveguiding and carrier confining layer 14, and a contact-facilitating layer 16. Supported by the upper surface of layer 16 are layers 18 of electrically insulating material which are spaced apart by a distance 40 approximately equal to the separation "d" between pump current guiding regions 8. A contact 20 is provided over layer 18 and the exposed portion of layer 16, and a contact 22 is provided along the lower surface of substrate 4, contacts 20 and 22 providing for electrical pumping of laser 2. The near and far faces of laser 2 are cleaved or provided with reflective surfaces to provide a resonant cavity.

Both layers 10 and 14 are of a material having a higher bandgap than the material of active region layer 12. One of the layers 10 and 14 is doped to have a conductivity type different from that of layer 12 to provide a rectifying junction along one planar surface of active region layer 12. As is well known, when a forward bias is applied to the rectifying junction extending along the planar surface of active region layer 12 electrons are injected into layer 12 and are confined to layer 12 by the potential difference produced by the heterojunctions 26 and 28. With sufficient pump current, population inversion is achieved and light waves are produced by radiative recombination of the carriers in the active region layer 12. Layers 10 and 14 guide the light waves produced by the radiative recombination of the carriers in layer 12.

Substrate 4 is of a material having a bandgap lower than that of the non-uniformly thick layer 10, with substrate 4 being of the same conductivity type as layer 10. As noted, regions 8 are of a conductivity type different from that of substrate 4 and layer 10 such that regions 8 are surrounded substantially by rectifying junctions 32. Layer 16 is comprised of a low bandgap material doped to have the same conductivity type as layer 14.

Specifically, substrate 4 can be n-type GaAs, layer 10 can be n-type Ga$_{1-x}$Al$_x$As, layer 12 can be p-type Ga$_{1-y}$Al$_y$As, layer 14 can be p-type Ga$_{1-x}$Al$_x$As, (y x), layer 16 can be p-type GaAs, and regions 8 can be p-type compensated regions of the substrate. Such a structure would provide a rectifying junction 30 along the lower planar surface of active region layer 12. Junction 30 is forward biased when a positive voltage is applied on electrode 20. When junction 30 is forward biased, junction 32 is reverse biased such that the path of pump current to active region layer 12 flows between regions 8 including channel 6. Since the width 40 of the portion of electrode 20 in contact with layer 16 is approximately equal to the separation "d" between regions 8, the width 40 of the pump current path is substantially uniform within layers 16, 14, 12, and 10, and the upper portion of substrate 4. Thus, the pump current has no gradients.

Figure 2:
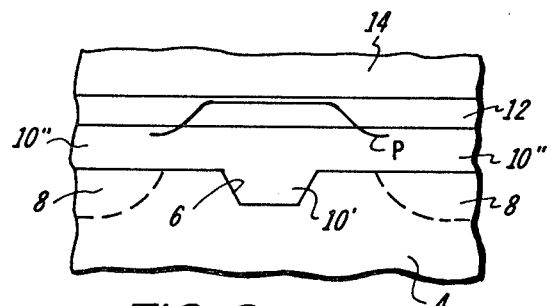
FIG. 2 depicts the current profile of the laser of FIG. 1.

As noted, the width of the pump current path is significantly wider than the width of the channel 6. The wide pump current path causes the current profile P of the laser 2 to be flat over the channel 6, as shown in FIG. 2. With the current profile flat over the substrate channel 6, the current profile does not effect the waveguiding and the channel structure is the sole mechanism guiding the light output. Since the channel configuration is fixed, channel guiding does not permit the laser mode to move and transverse mode control can be achieved.

Figure 3:
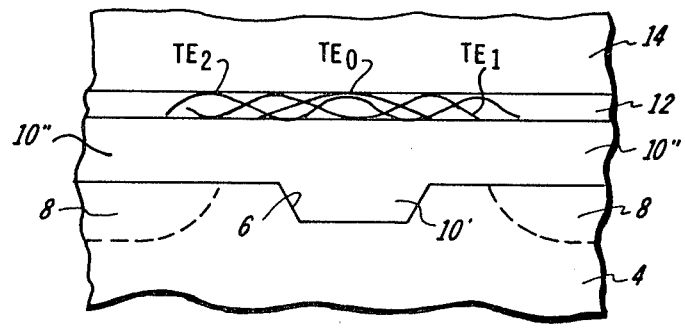
FIG. 3 depicts the transverse mode structure of the laser of FIG. 1.

Not only does the laser 2 achieve transverse mode control, it achieves lowest order transverse mode output due to the non-uniform thickness of layer 10. As is well known, the light produced by the laser 2 when junction 30 is forward biased beyond threshold contains multiple, ordered transverse modes. Significant suppression of all but the lowest order transverse mode is achieved due to the non-uniform thickness of layer 10. As shown in FIG. 3, the energy distribution of the lowest order transverse mode $TE_o$ is primarily over the thick portion 10' of layer 10 and that energy distribution is displaced significantly from substrate 4, which, due to its low bandgap relative to layer 10, attenuates (or absorbs) light more readily than layer 10. Thus, the energy distribution of the lowest order transverse mode does not leak significantly into substrate 4 where it could be attenuated. However, significant portions of the energy distribution of the higher order transverse modes, $TE_1$ and $TE_2$ of which are shown in FIG. 3, are over the thinner portions 10' of layer 10 and thus leak into the light attenuating substrate 4 such that the higher order transverse modes are absorbed and thereby suppressed.

As an example of device dimensions, using the specific compositions previously set forth for the layers and the substrate, portion 10' of layer 10 should be about 2–5 times thicker than portions 10" of layer 10. As specific examples, portion 10' can be 0.6–2.0 microns thick with about 1 micron being preferred, portions 10" can be 0.1–1.0 microns with about 0.3 microns being preferred, active region layer 12 can be between 0.01–0.3 microns thick, channel 6 can be about 5 microns wide, and the distances "d" and 40 can be on the order of 10–15 microns. The specific thicknesses of the layer components of laser 2 depend on many design parameters, such as doping density, etc., and adjustment of thicknesses would require consideration of those parameters. Regions 8 can be about 1 micron thick, and layers 14 and 16 can be about 2.0–3.0 and 0.1–1.0 microns thick, respectively.

Fabrication of laser 2 commences by forming regions 8 by a masking and diffusion technique, such as that described in U.S. Pat. No. 3,984,262, with a silicon nitride mask and zinc diffusion being preferred. Next, channel 6 in the substrate 4 is formed by photolithographic and etching techniques as described in detail in U.S. Pat. No. 3,978,428. Layers 10,12,14 and 16 are grown next in a conventional manner, such as by means of liquid phase epitaxial growth, molecular beam epitaxy or chemical vapor deposition. After the layer growth, the laser can be annealed, for example, at a temperature on the order of 700° C. for about 45 minutes, to drive the rectifying junctions 32 into the higher bandgap material where they are less likely to break down due to light absorption.

The path of pump current on the substrate side can be controlled in conventional ways other than by reverse biased junctions. For example, regions 8 could be of intrinsic material. Likewise, the path of pump current on the non-substrate side can be controlled in other conventional ways, such as, selective diffusion, selective etching or proton or ion implantation. Also, channel 6 can be formed in other conventional ways such as, for example, ion milling, plasma etching and selective epitaxy.

We claim:

1. A heterojunction solid state laser comprising:
a semiconductor body including a substrate and a plurality of layers, one of said layer being an active region layer, said layers being doped to provide a rectifying junction adjacent said active region layer;
another of said layers being a layer of non-uniform thickness having at least one thick portion, said layer of non-uniform thickness being of a material having a bandgap higher than the bandgap of the material of said active region layer;
resonator means for providing an optical resonant cavity including said active region layer;
electrode means on the substrate and non-substrate sides of said semiconductor body for the application of forward bias to said rectifying junction to provide pump current to said active region layer of said laser; and
pump current confining means for providing that the path of said pump current includes said thick portion of said layer of non-uniform thickness and that the width of the path of said pump current is substantially wider than the width of said thick portion of said layer of non-uniform thickness.

2. The laser of claim 1 in which said pump current confining means includes on the substrate side of said laser a pair of body portions separated by a distance greater than the width of said thick portion of said layer of non-uniform thickness and non-conducting of said pump current when said rectifying junction is forward biased.

3. The laser of claim 2 in which said pump current confining means further includes on the non-substrate side of said laser a pair of body portions separated by a distance greater than the width of said thick portion of said layer of non-uniform thickness and non-conducting of said pump current when said rectifying junction is forward biased.

4. The laser of claim 1 in which said pump current confining means includes on the substrate side of said laser a pair of body portions separated by a distance greater than the width of said thick portion of said layer of non-uniform thickness and non-conducting of said pump current when said rectifying junction is forward biased, and the surface of said electrode means on the non-substrate side of said semiconductor body through which pump current flows has a width greater than the width of said thick portion of said layer of non-uniform thickness.

5. The laser of claim 4 in which said surface of said electrode is aligned with the portion of said laser separating said pair of body portions.

6. The laser of claim 3 in which said body portions on the substrate side of said laser are aligned with said body portions of the non-substrate side of said laser.

7. A heterojunction solid state laser comprising:
a semiconductor body including a channeled substrate and a plurality of layers, one of said layers being an active region layer, said layers being doped to provide a rectifying junction adjacent said active region layer;

said layer adjacent said substrate being of non-uniform thickness having a thick portion adjacent the channel in said substrate, said layer of non-uniform thickness being of a material having a bandgap higher than the bandgap of the material of said active region layer;

resonator means for providing an optical resonant cavity including said active region layer;

electrode means on the substrate and non-substrate sides of said semiconductor body for the application of forward bias to said rectifying junction to provide pump current to said active region layer of said laser; and pump current confining means for providing that the path of said pump current includes said thick portion of said layer of non-uniform thickness and that the width of the path of said pump current to said active region layer is substantially wider than the width of said channel in said substrate.

* * * * *